Figure 14:
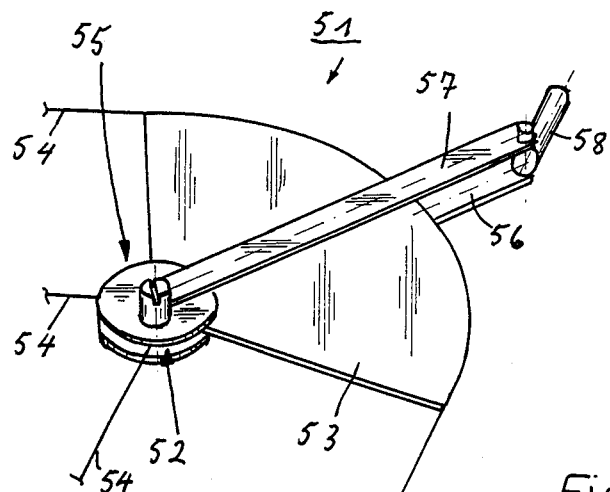

United States Patent [19]

Grau

[11] Patent Number: 4,837,667

[45] Date of Patent: Jun. 6, 1989

[54] LIGHTING SYSTEM WITH LAMPS ARRANGED BETWEEN TWO LOW-VOLTAGE CONDUCTORS

[76] Inventor: Tobias Grau, Lippmannstrasse 72-74, DE-2000 Hamburg 50, Fed. Rep. of Germany

[21] Appl. No.: 213,703
[22] PCT Filed: Oct. 2, 1987
[86] PCT No.: PCT/EP87/00566
§ 371 Date: Jun. 1, 1988
§ 102(e) Date: Jun. 1, 1988
[87] PCT Pub. No.: WO88/02460
PCT Pub. Date: Apr. 7, 1988

[30] Foreign Application Priority Data
Oct. 3, 1986 [DE] Fed. Rep. of Germany ....... 3633792
Jan. 13, 1987 [DE] Fed. Rep. of Germany ....... 8700563

[51] Int. Cl.⁴ ................................................ F21S 1/02
[52] U.S. Cl. ................................... 362/147; 362/404; 362/407; 362/419; 362/427; 362/430; 362/432; 362/275
[58] Field of Search ............... 362/404, 407, 408, 418, 362/419, 427, 430, 432, 285, 287, 368, 370, 371, 372, 145, 147, 382, 269, 275, 405, 406; 439/6, 10, 13; 248/324

[56] References Cited

U.S. PATENT DOCUMENTS

| 3,512,743 | 5/1970 | Lipscomb | 362/404 |
| 3,748,463 | 7/1973 | Trassinelli | |
| 4,219,869 | 8/1980 | Bowman et al. | 362/404 |
| 4,747,025 | 5/1988 | Barton | 362/147 |
| 4,758,935 | 7/1988 | Frossati et al. | 362/147 |

FOREIGN PATENT DOCUMENTS

| 2037285 | 2/1972 | Fed. Rep. of Germany | 362/404 |
| 8602831 | 10/1986 | Fed. Rep. of Germany | |
| 680114 | 10/1952 | United Kingdom | |

Primary Examiner—Ira S. Lazarus
Assistant Examiner—D. M. Cox
Attorney, Agent, or Firm—Sixbey, Friedman, Leedom & Ferguson

[57] ABSTRACT

Lighting system comprising in particular projectors arranged between two low-voltage conductors, to which they are connected in an electrically manner. Each projector comprises a base on which are arranged radially on the longitudinal axis current-carrying bars, which are connected to the conductors by means of supports provided with fixtures.

25 Claims, 8 Drawing Sheets

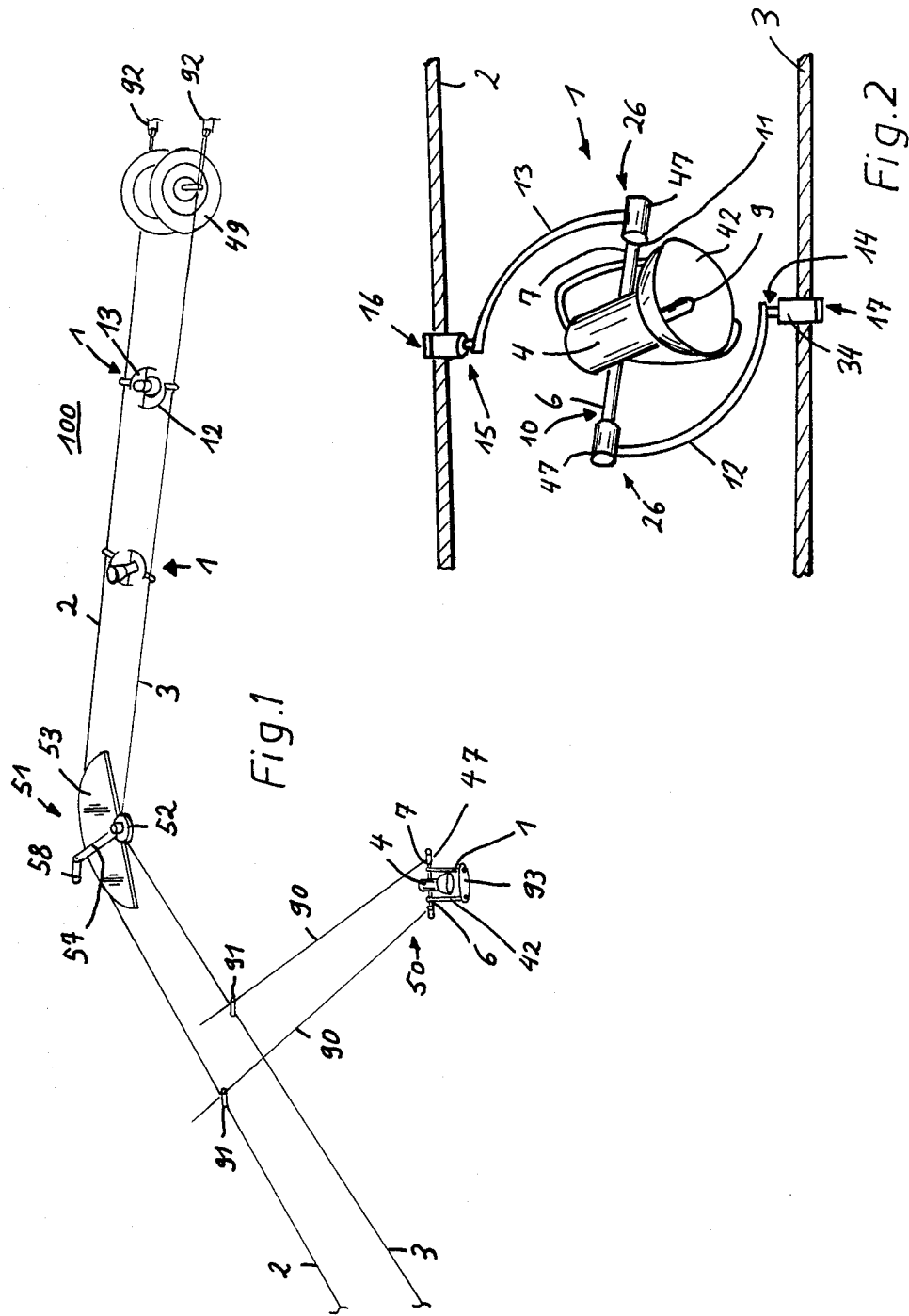

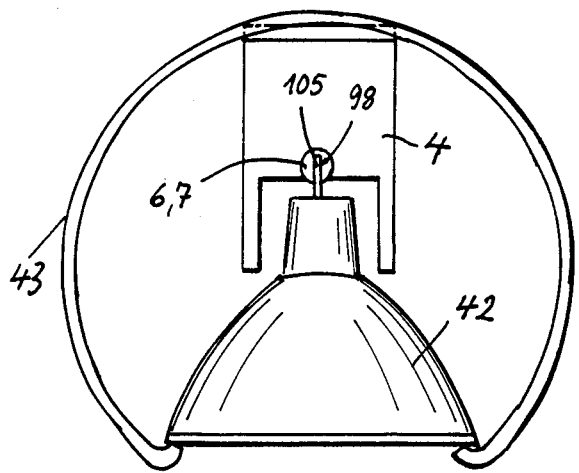
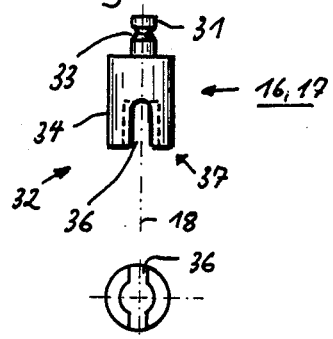
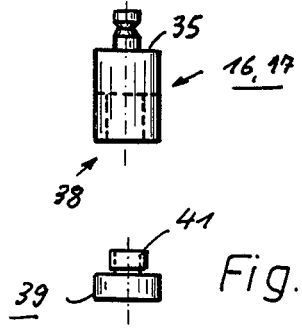
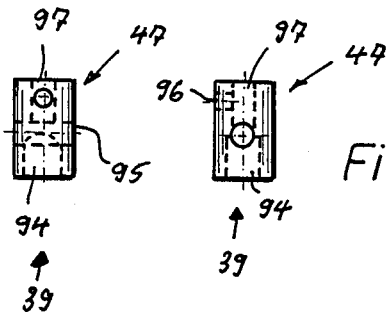

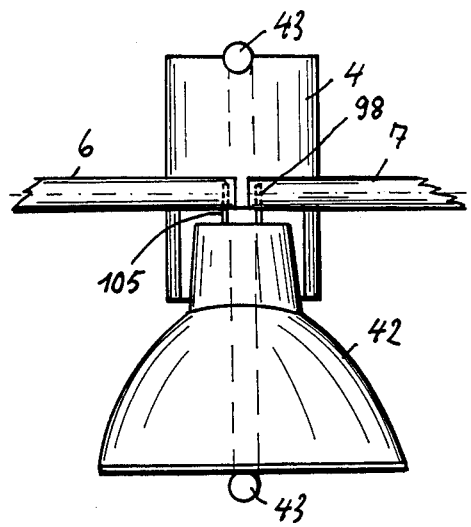
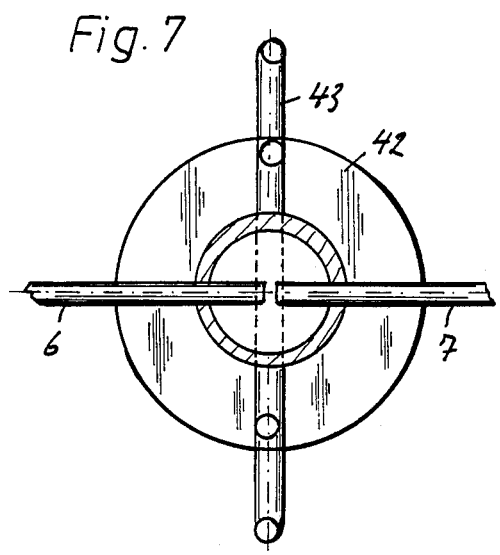
Fig. 6  Fig. 7
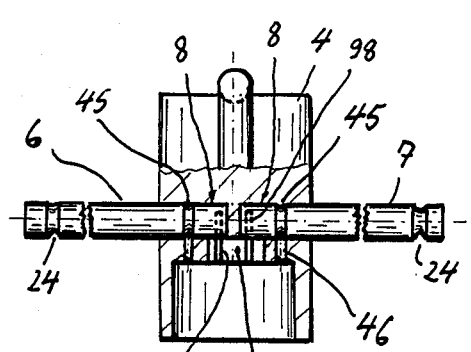
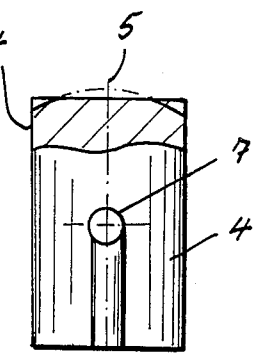
Fig. 8  Fig. 9
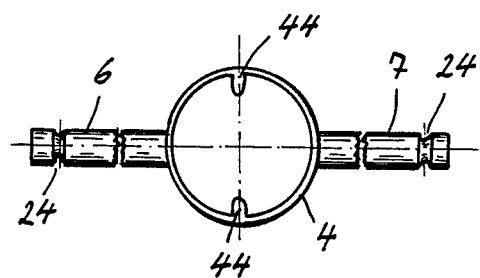
Fig. 10

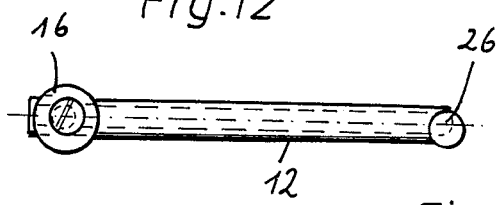
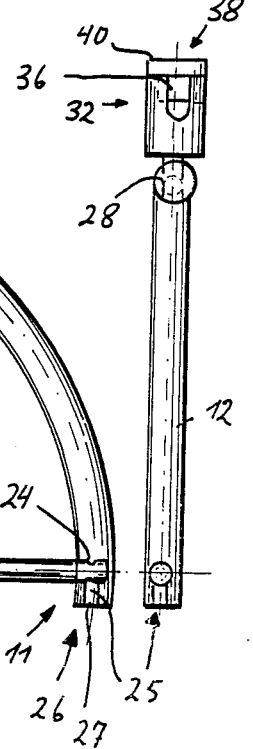
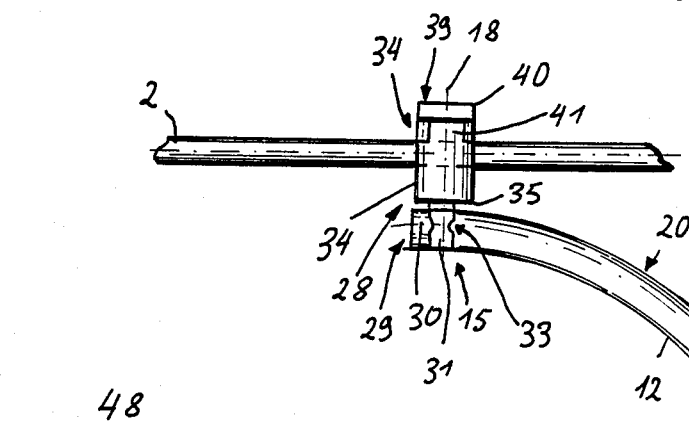
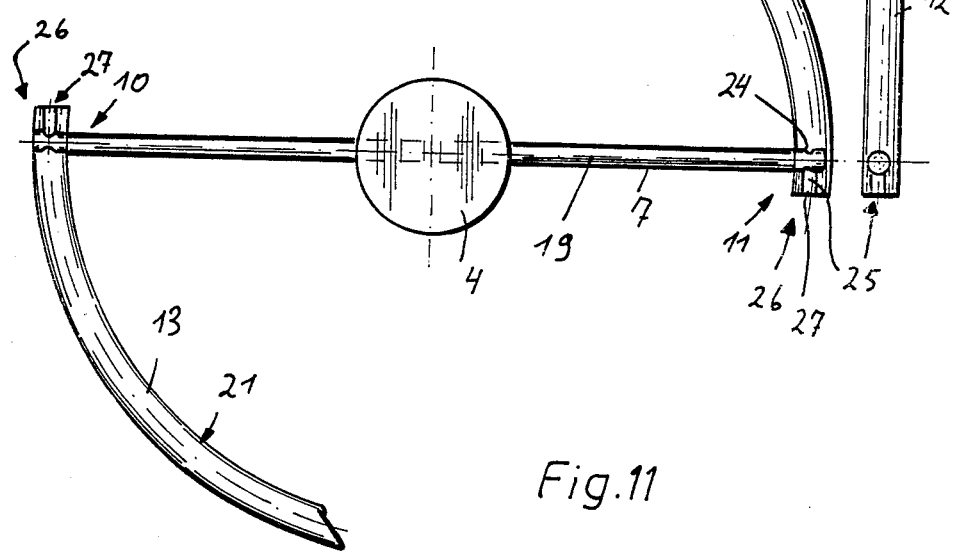
Fig. 12
Fig. 13
Fig. 11

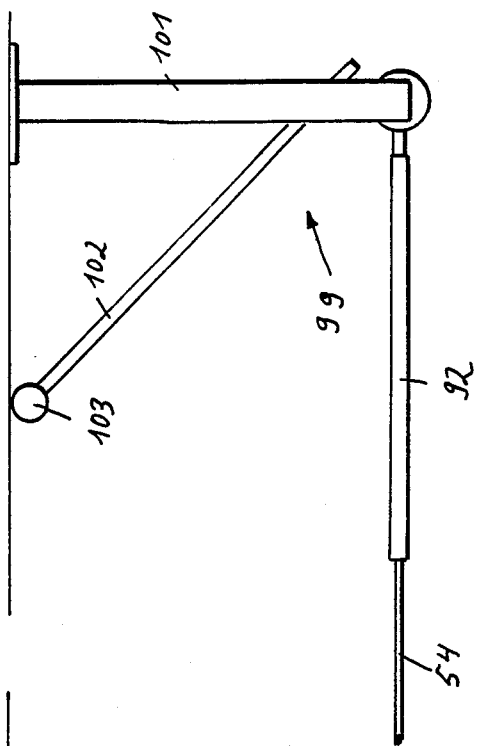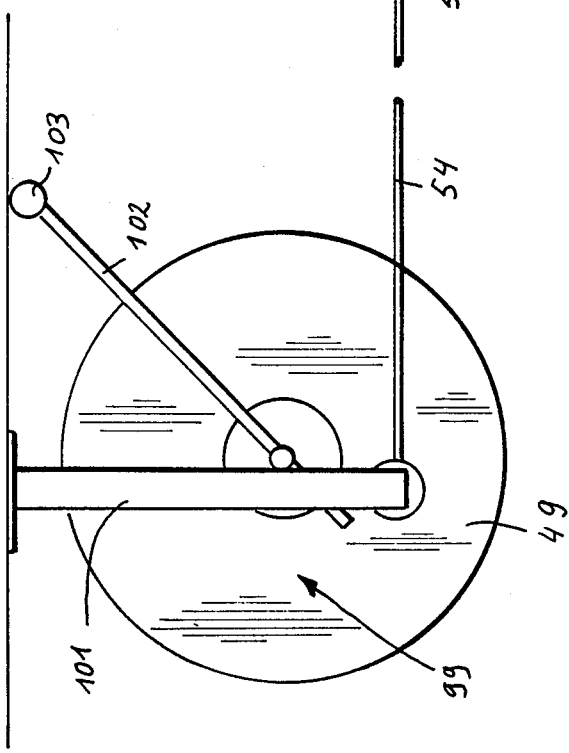

LIGHTING SYSTEM WITH LAMPS ARRANGED BETWEEN TWO LOW-VOLTAGE CONDUCTORS

The invention relates to a lighting system comprising lamps, in particular projectors, arranged between low-voltage conductors, whereby conductors provided for instance as ropes, cables, or wires are parallel arranged and fixed by means of holding devices, and lamps are connected to conductors by means of two electrically conductive barshaped supports and, in an electrically conductive manner, by means of fixtures arranged at supports.

Lighting systems of the prior art are known to have plates arranged as webs between conductors, interconnected by means of screw mountings and clamped to the conductors. The projector is fixed to the plates and supplied with current from the conductors through a particular cable. This common lighting system is difficult to install and to adjust with regard to the beam angle. The plates arranged as webs are furthermore irritating, giving a relative rude impression compared to the conductors. The conductors must further be braced between opposite surfaces, such as walls. This is a disadvantage, because several pairs of conductors are necessary for large area room lighting and a low tension transformer must be provided for each of them. Further, several bracing and fixing means are necessary so that assembly is time-consuming and expensive.

The object of the invention is to provide a said lighting system, which is easy to install and to adjust, whereby projectors are optically conformed to the conductors and special cables are not necessary for the projectors, and whereby a deviation of the conductors within the range of small angles up to 180° can be adjusted between support surfaces by means of suited holding devices.

According to the invention the problem is solved in that two conductors are diametrically arranged at the lamp holder radially to its longitudinal axis, connected to contacts of the bulb inside the lamp holder, pivoted at their outer end sections in each case to one electrically conducting bar-shaped support, which comprises a rotatable fixture with a swivelling axis arranged to the longitudinal axis of current-carrying bars, whereby each fixture can be connected to a current conductor that its surface areas, that are arranged normal to the swivelling axis, parallelly arranged relative to the longitudinal axis of the current-carrying bars, and that for support of the current conductors two deviation segments with a guidance for a rope, cable, wire or the like are provided, interconnected by means of a holding device, pivoted to a wall support by means of a ceiling support or by means of at least one supporting arm. Each lamp can be adjusted to achieve a beam angle desired by means of the cardanic lamp mounting between the conductors. Further, the lighting system with the conductors give a very filigreed impression, in particular when several lamps are installed, so that lighting system can be used not only of illumination, but also as a creative element in closed rooms.

Further features of the invention are described in the subclaims and will be explained according to the embodiments shown in the drawings. It shows FIG. 1 a section of the lighting system according to the invention in a diagrammatic perspective view, FIG. 2 a projector between two conductors in a diagrammatic view, FIGS. 3a to 3d a fixture of the projector according to FIG. 2 in different views, FIGS. 4a and 4b a holding bush for the supports of the projector in a diagrammatic cross view, FIGS. 5 and 6 an altered embodiment of the projector in diagrammatic side views, FIG. 7 the projector according to FIG. 5 in a diagrammatic top view, FIGS. 8 to 10 the lamp holder of the projector in side views and in a top view, FIG. 11 the supporting frame of the projector in a diagrammatic top view, FIGS. 12 and 13 the supporting frame according to FIG. 11 in two side views, FIG. 14 the holding device in a perspective view, FIG. 15 the holding device according to FIG. 14 in a top view, FIG. 16 the holding device according to FIG. 14 in a sectional view, FIG. 17 the deviation device of the holding device in an enlarged sectional side view, FIGS. 18 and 19 further embodiments of a deviation device in perspective views, FIG. 20 a lamp ballast with a ceiling support in a side view, FIG. 21 a ceiling support with a cable tightener in a side view.

Lighting system 100 consists of two parallel arranged low-voltage current conductors 2, 3 being connected to lamps 1, as well as a suspended lamp 50. The lamp holders 4 of lamps 1 are connected to bar-shaped supports 12, 13 provided as quarter circle and connected to low-voltage current conductors 2, 3 by means of current-carrying bars 6, 7. Lamp 1 of suspended lamp 50 is connected by means of current-carrying bars 6, 7 to current-carrying bars 90, which are connected to a low-voltage current conductor 2, 3 by means of a fixture 91. Current-carrying bars 6, 7 are connected to lamp holder 4. An antiglare plate 93 is arranged in front of and remote from the projector holder 42 of the suspended lamp 50. Deviation of low voltage current conductors 2, 3 is performed by means of deviation segments 52, 53 in the region of a holding device 51. Low-voltage current conductors 2, 3 are connected at one end section to a lamp ballast comprising a transformer and being connected by means of cable tighteners 92 to a holder, which is not shown in detail. According to the desired deviation of low-voltage current conductors 2, 3, the circle segment provided as deviation segment 53 may have an opening angle of different size.

If the lighting system 100 is used as a creative room element, it is an advantage, to provide the low-voltage current conductors 2, 3 with a number of lamps 1, possibly suspended lamps 50, which give the general impression of a filigree lamp network.

Lamp 1, shown in FIG. 2, comprises a lamp holder 4, at which a projector bulb holder 42 with a bulb 9 is arranged. The projector bulb holder 42 is fixed by means of a clamp bow 43 at the lamp holder 4. At this, two current-carrying bars 6, 7 are diametrically arranged, radially to longitudinal axis 5 of lamp holder 4, pivoted at their outer end sections 10, 11 to the specific electrically conducting rod shaped support 12, 13. Each support 12, 13 forms a quarter circle. At the end sections 14, 15, opposite to current-carrying bars 6, 7, each support 12, 13 is connected to a fixture 16, 17, which is pivoted at supports 12, 13. The fixtures 16, 17 are connected to low-voltage current conductors 2, 3. Each fixture 16, 17 comprises a cylinder 34 with a bearing journal 31 arranged at the front 35. Cross-wise to longitudinal axis 18 of fixture 16, 17, an opening 36 is so arranged that section 32 of cylinder 34, opposite to bearing journal 31, is provided as fork-shaped piece 37, which is open at one end. The opening section 38 of this fork-shaped piece 37 can be closed by means of a closing member 39. Closing member 39 is provided as closing cap 40 at which a threaded journal 41 is provided. For closing of the opening section 38 closing cap 40 can be screwed into cylinder 34 by means of threaded journal 41. Threaded journal 41 is therefore used as clamping member, which can be used to jam the fixture 16, 17 to a current conductor 2, 3 (FIGS. 3a–3d). The combined effects of the rotary joints arranged at end sections 15, 26 of supports 12, 13, provide a cardanic mounting of the lamp holder 4, that any beam angle of lamp 1 can be achieved.

At each end section 10, 11 of current-carrying bars 6, 7, a holding bush 47 is provided, which is rotatably arranged at the current-carrying bars 6, 7 and connected to end sections 26 of supports 12, 13. Each holding bush 47 is provided with a through hole 95, which is transversally arranged to longitudinal axis and where the outer end section 26 of support 12, 13 is passed through. Each specific support 12, 13 can be clamped in the through hole 95 by means of closing member 39. A further opening 97 for current-carrying bars 6, 7 is provided coaxially to longitudinal axis of holding bush 47. The current-carrying bars 6, 7 can be clamped in these openings 97 by means of clamping screws which are inserted in integral nuts 96 of closing member 39 (FIGS. 4a and 4b).

By connecting a fixture 16, 17 to a holding bush 47, a fixture 91 can be used for mounting a current-carrying bar 90 at a low-voltage current conductor 2, 3. Therefor, bearing journal 31 of cylinder 34 is inserted in opening 97 of holding bush 47 and clamped by means of a screw, which is screwed in screw bore 96. The opening 36 of cylinder 34 is used for receiving a low-voltage current conductor 2, 3, whereas a current-carrying bar 90 is clamped in through hole 95 of holding bush 47.

Lamp 1 is diagrammatically shown in FIGS. 5 to 7. Two blind holes 8 are provided in lamp holder 4, arranged oppositely, used for receiving a current-carrying bar 6, 7. An opening 106 is further provided in the lower region of lamp holder 4 with freely arranged end sections of current-carrying bars 6, 7 insert4ed in blind holes 8. Further, a blind hole 98 opened below is provided in each end section of current-carrying bars 6, 7, in which a contact 105 of the bulb 9 of lamp 1 is inserted (FIGS. 5, 6, 8). A groove 45 is provided at the end sections of current-carrying bars 6, 7 inserted in the lamp holder 4. A pin 46 is guided in said groove 45 to secure the specific current-carrying bar 6, 7 of lamp holder 4 against shifting (FIG. 8). Instead of a pin 46, a screw or the like can also be used. It is also possible, not to provide a groove 45 at the end sections of current-carrying bars 6, 7, but to stick the end sections of each current-carrying bar 6, 7 in the particular blind hole 8 of lamp holder 4. In this case, pins 46 are not necessary.

As shown in FIGS. 5 and 10, the clamp bow 43 is arranged in guiding grooves 44, provided at that side of lamp holder 4 remote from projector holder 42. Guiding grooves 44 avoid side shifting of clamp bow 43. Clamp bow 43 presses the contacts 105 of bulb 9 into the particular blind hole 98 by means of projector holder 42 so that a steady current contact to the particular current-carrying bar 6, 7 is achieved.

A further embodiment of a frame of lamp 1 is diagrammatically shown by an enlarged representation in FIGS. 11 to 13. Each support 12, 13 is provided as a circular ring segment 20, 21 having an angle of 90°. At each end sections 22, 23 of current-carrying bars 6, 7 a groove 24 is provided, in which a screw 25 arranged in support 12, 13 is engaged. Therefor, a threaded hole 27, in which screw 25 is inserted, is provided at the front end sections 26 of supports 12, 13, arranged towards the current-carrying bars 6, 7. In the front section 28 of support 12, 14, arranged towards fixture 16, 17, a threaded hole 29 is also provided. A screw 30 is arranged herein, which can be put against the bearing journal 31, 32 of fixture 16, 17, inserted in the support 12, 13. A groove 33 is provided at each bearing journal 31, 32, against which the screw 30 located in threaded hole 29 can be put.

Figure 15:
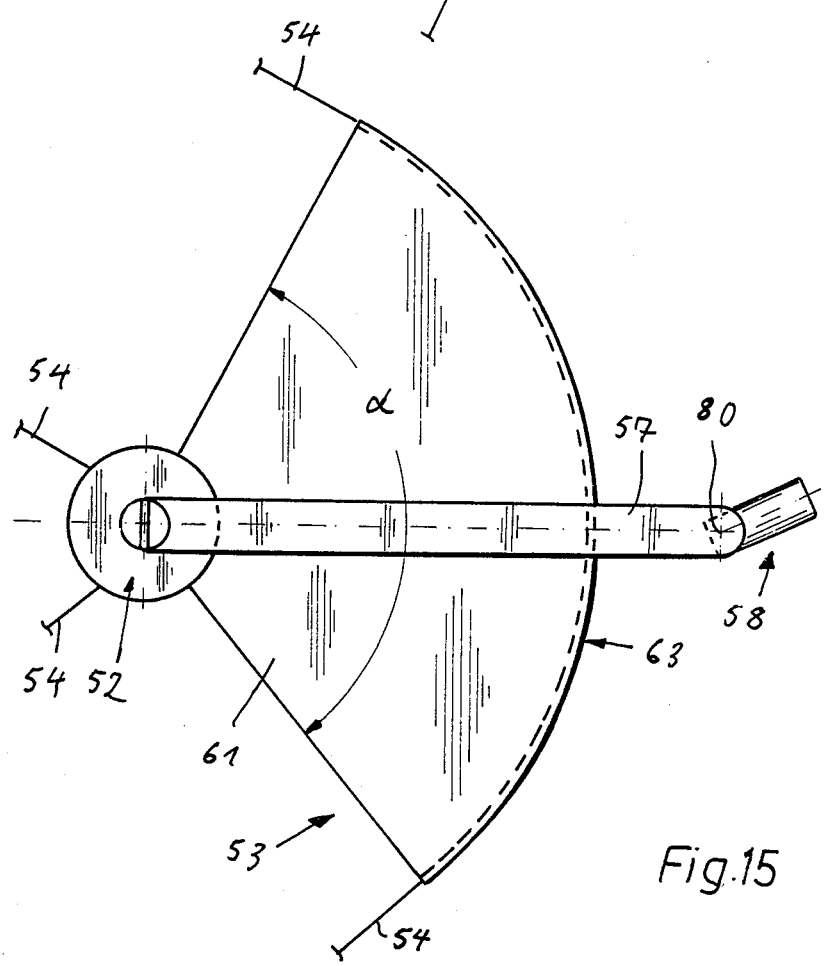
Figure 16:
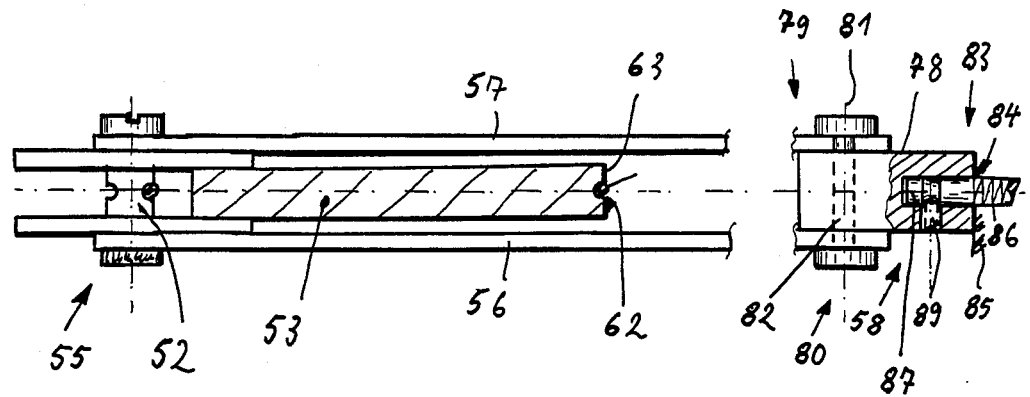

The holding device 51, shown in FIGS. 14 and 15, comprises two deviation segments 52, 53, carrying one cable 54 as current conductor 2, 3 in each case. The deviation segments 52, 53 are interconnected by means of a holding device 55. Holding device 55 is pivoted to a wall support 58 by means of two supporting arms 56, 57. This one can be fixed for instance at a wall 85.

Figure 17:
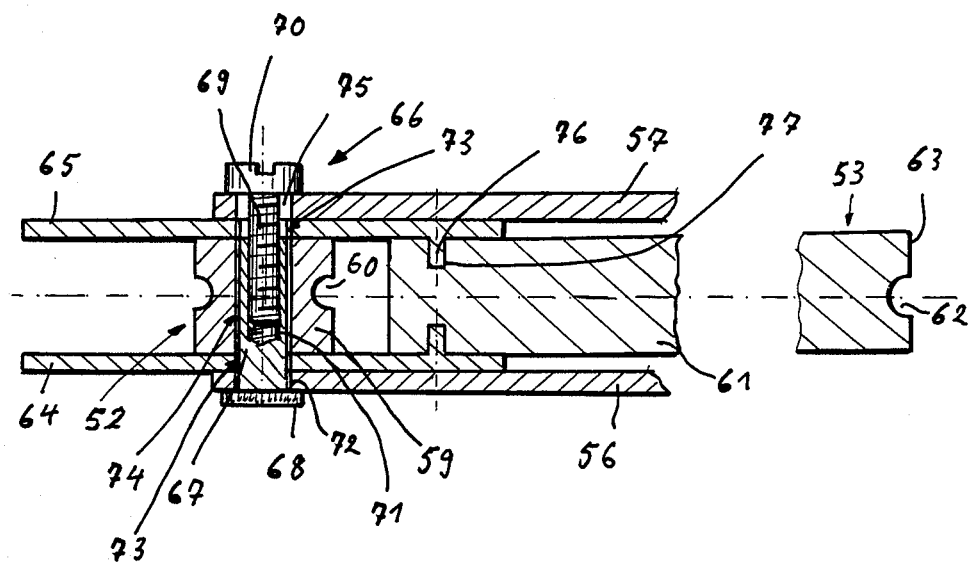

The deviation device of holding device 51 is shown in detail in FIG. 17. One deviation segment 52 is provided as a bush 59 with an outer circulating groove 60, carrying a cable 54. The other deviation segment 53 is provided as a disk segment 61 with a groove 62 in the outer arc area 63. The deviation segments 52, 53 are interconnected by means of clamping plates and attached to both supporting arms 56, 57 by means of a screw connection 66. Screw connection 66 consists of a threaded sleeve 67 with a stop flange 68 and a screw 69 with screw head 70, which can be screwed into threaded sleeve 67. The threaded sleeve 67 is passed through an opening 72 in lower supporting arm 56, through openings 73 in clamping plates 64, 65, and through opening 74 in bush 59, which is the deviation segment 52. The screw 69 is inserted in an opening 75 in the other supporting arm 57 and screwed in the blind hole 71 with inside thread of threaded sleeve 67. The supporting arms 56, 57 are pressed against clamping plates 67, 65 by means of stop flange 68 and screw head 70.

Guiding devices can be provided in the clamping plates 64, 65, which interlock in the deviation segment 53. Therefore, e.g. webs or pins 76 can be provided as guiding devices, which interlock in the grooves or openings 77 of disk 61.

Wall support 58 comprises a bar-shaped basic body 78 with a circular or cornered cross section. At one end section 79 supporting arms 56, 57 are so arranged by means of a screw connection 80 that they can be turned around the center axis 81 of threshold bolt 82. At the other end section 83, the basic body 78 is, connected to a wall support 84. Wall support 84 may consist of a screw shank 86, which is for instance screwed in a plug in a wall 85. A projecting pin 87 is provided in screw shank 86, inserted in an opening 88 of the bar-shaped basic body 78 and clamped by means of a screw 87 arranged at basic body 78.

The clamping plates 64, 65, the deviation segments 52, 53, the supporting arms 56, 57, and the bar-shaped basic body 78 can be made of metal or plastics. For aesthetic reason, the plastics can also be transparent.

According to the deviation angel desired for the cables 54, a deviation segment 53 with an adapted deviation angel α can be arranged between clamping plates 64, 65 and connected to the holding device 55. Hereby it is possible, to arrange by simple means e.g. low voltage current conductors distributed in rooms even at an angle, without providing additional transformers.

Figure 19:
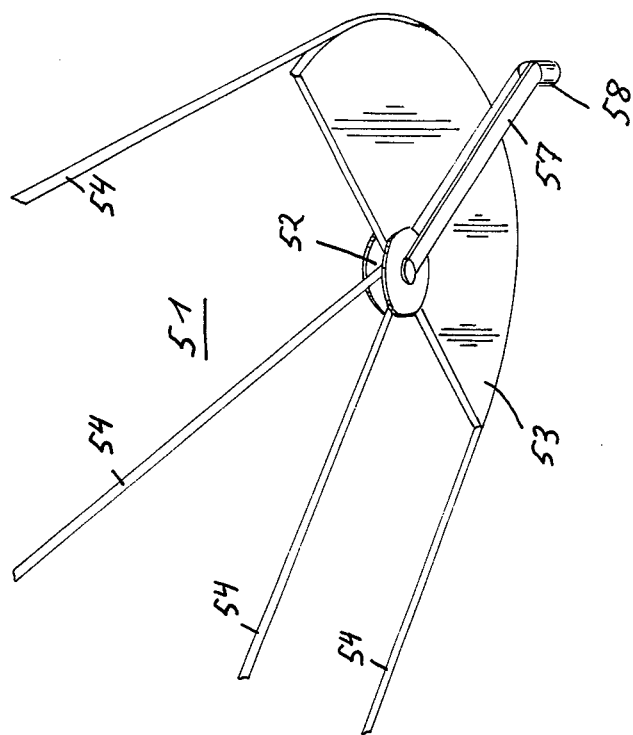
Figure 18:
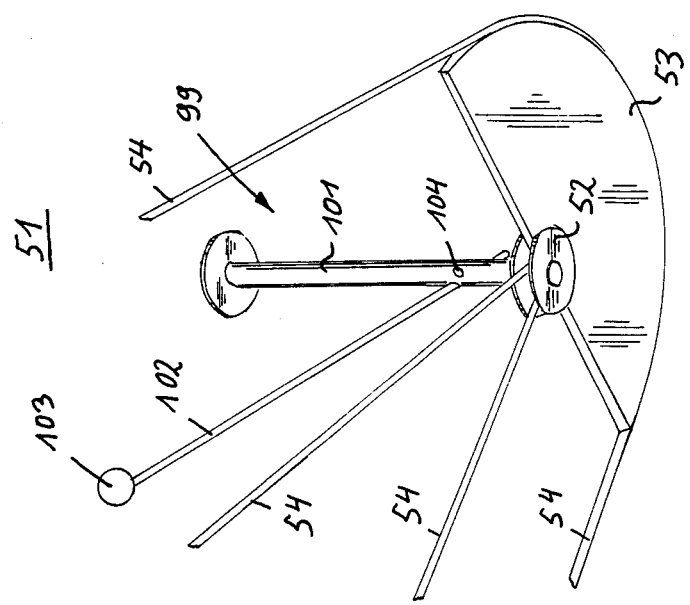

One holding device 51 is shown each case in FIGS. 18 and 19 providing deviation segments 53 with a deviation angle α of 180°. Whereas according to FIG. 19 holding device 51 is connected to wall support 58 by means of supporting arm 57 and, the deviation segment 52 of holding device 51 is connected to ceiling support 99 according to FIG. 18. Ceiling support 99 comprises a distance bar 101 that is connectable to the ceiling, and is supported at the ceiling, in the pull direction of cables 54, by means of a supporting bar 102. Supporting bar 102 sits close to the ceiling with a spherical end section 103. Further, the supporting bar 102 is passed through an opening, not shown in detail, in the distance bar and can be arrested by means of a locking screw 104.

It is also possible, to attach the lamp ballast 49 and the cable tightener to ceiling supports 99 (FIGS. 20 and 21). The lamp ballast 49 is practically so provided that it can be fixed to the supporting bars 102, as well as possibly to the cable tightener.

What is claimed:

1. Lighting system with lamps electrically connected between a pair of low-voltage conductors in the form of one of ropes, cables and wires, each lamp comprising
   a lamp holder with a bulb holder and electrical contacts for a bulb;
   current-carrying bars connected to said contacts and extending radially from said lamp holder relative to a longitudinal axis of the lamp holder, and
   supports for connecting the current-carrying bars to the low-voltage conductors, each support being provided with a rotatable fixture and a pivotal holding element, and each support being rotatably connected to a respective one of the low-voltage conductors by said rotatable fixture for rotation about a rotational axis extending normal to said current-carrying bars and being pivotally connected to said current-carrying bars by said pivotal holding element for pivoting about a pivot axis that is parallel to said current-carrying bars, thereby creating a universal mounting of each lamp; and
   wherein a holding device having a deviating means for producing an angle of deviation in a mounted configuration of the low-voltage conductors is provided, said deviating means comprising a pair of deviation segments for supporting the low-voltage conductors, each of said deviating means being provided with a guide for a respective one of the low-voltage conductors, wherein said deviation segments are interconnected together, and wherein said holding device has mounting means for pivotally mounting said deviating means to a supporting wall.

2. Lighting system according to claim 1, wherein said mounting means comprises supporting arms that are pivotally connected to a wall support means for mounting of the holding device on a wall, ceiling or the like.

3. Lighting system according to claim 1, wherein said deviation segments are circular ring segments having an angle of 90°.

4. Lighting system according to claim 1, wherein each pivotal holding element comprises a groove that is provided at an end section of a respective current-carrying bar, said end section being inserted in a respective support, and a screw that is arranged in the support and is received in said groove.

5. Lighting system according to claim 4, wherein said screw is inserted in a threaded hole that is provided at a front end section of the support directed towards the current-carrying bar.

6. Lighting system according to claim 1, wherein each said rotatable fixture comprises a bearing journal which is inserted in a respective support, said support having a threaded hole, in a front section of the support, that is directed towards the fixture, and wherein a screw is arranged in said threaded hole and engaged with said bearing journal.

7. Lighting system according to claim 6, wherein a groove is provided in the bearing journal, and receives the screw arranged in the threaded hole.

8. Lighting system according to claim 1, wherein the rotatable fixture comprises a fork-shaped piece having a bearing journal at one end and an opening for receiving a respective low-voltage conductor, said opening extending crosswise to a longitudinal axis of the rotatable fixture and being at an opposite end of the fork-shaped piece relative to said bearing journal, and a closing member for closing said opening.

9. Lighting system according to claim 8, wherein said closing member is a closing cap with a threaded journal.

10. Lighting system according to claim 1, wherein a flexible wire clamp bow is arranged around the lamp holder as a means for clamping the bulb holder.

11. Lighting system according to claim 10, wherein guiding grooves for fixing the clamp bow are provided at a side of the lamp holder which is opposite a side at which said bulb holder is disposed.

12. Lighting system according to claim 3, wherein an end section of each current-carrying bar is inserted into the lamp holder, said end section being provided with a groove into which a connector screw or pin of the lamp holder is inserted.

13. Lighting system according to claim 12, wherein a blind hole is provided in each said end section of the current-carrying bars that is inserted in the lamp holder, and wherein one of the electrical contacts for the bulb is inserted in said blind hole.

14. Lighting system according to claim 1, wherein an end section of each current-carrying bar is inserted into the lamp holder and is connected therein by means of adhesive joints.

15. Lighting system according to claim 1, wherein said pivotal holding element comprises a holding bush arranged at an outer end section of each current-carrying bar, said holding bush being rotatable around the current-carrying bars and connected to an end section of a respective support.

16. Lighting system according to claim 2, wherein a first one of said deviation segments comprises a bush with a circumferentially extending outer groove, and wherein a second one of said deviation segments is a disk segment with a groove in an outer arc area thereof, said deviation segments being interconnected by means of clamping plates, said clamping plates being fixed to said supporting arms by means of a screw connection.

17. Lighting system according to claim 16, wherein said screw connection comprises a threaded sleeve with a stop flange, said threaded sleeve extending through an opening of one supporting arm, through openings in said clamping plates and through an opening in the first of the deviation segments, and a screw with a screw head, said screw being inserted in an opening in another supporting arm and threaded into said threaded sleeve in a manner pressing said supporting arms against said clamping plates between the stop flange and screw head.

18. Lighting system according to claim 16, wherein the clamp plates are provided with guiding devices that interlock in the second of the deviation segments.

19. Lighting system according to claim 18, wherein the guiding devices are in the form of one of webs and pins, and interlock within corresponding grooves and openings, respectively, formed in the disk segment.

20. Lighting system according to claim 2, wherein the mounting means is a wall support having a bar-shaped body with a first end section to which the supporting arms are rotatably connected by threshold bolt by means of a screw connection, and a second end section which is connected to a wall support.

21. Lighting system according to claim 20, wherein the wall support comprises a screw shank and a projecting pin, said projecting pin being inserted in an opening of the bar-shaped body and clamped therein by means of a clamping screw arranged in the bar-shaped body.

22. Lighting system according to claim 2, wherein said mounting means is a ceiling support having a distance bar that is connectable to a ceiling and a support bar means for supporting the distance bar at the ceiling in a pull direction of cables used as said low-voltage conductors.

23. Lighting system according to claim 16, wherein said clamping plates, deviation segments, supporting arms and a bar-shaped body of the mounting means are made of metal.

24. Lighting system according to claim 16, wherein said clamping plates, deviation segments, supporting arms and a bar-shaped body of the mounting means are made of plastics.

25. Lighting system according to claim 24, wherein the plastics are transparent.

* * * * *